(12) United States Patent
Han et al.

(10) Patent No.: US 6,259,265 B1
(45) Date of Patent: Jul. 10, 2001

(54) UNIFIED TEST SYSTEM AND METHOD FOR TESTING PRINTED CIRCUIT BOARDS

(75) Inventors: Jong-Hyung Han; Yong-Taek Sim, both of Kumi; Tae-Young Kwak, Kyongsangbuk-do, all of (KR)

(73) Assignee: SamSung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/417,060

(22) Filed: Oct. 13, 1999

(30) Foreign Application Priority Data

Oct. 13, 1998 (KR) .................................. 98-42751

(51) Int. Cl.[7] .............................. G01R 1/04; G01R 31/02; G01R 1/06
(52) U.S. Cl. ......................... 324/761; 324/538; 324/754; 324/755; 324/758; 324/537
(58) Field of Search ................................. 324/761, 754, 324/756, 538, 755, 537

(56) References Cited

U.S. PATENT DOCUMENTS

| | | | |
|---|---|---|---|
| 4,344,033 | 8/1982 | Stowers et al. | 324/754 |
| 4,626,780 | 12/1986 | Powers et al. | 324/754 |
| 4,749,943 | * 6/1988 | Black | 324/754 |
| 4,829,241 | * 5/1989 | Maelzer | 324/754 |
| 5,214,374 | 5/1993 | St. Onge | 324/754 |
| 5,247,249 | 9/1993 | Seavey | 324/756 |
| 5,283,605 | 2/1994 | Lang-Dahlke | 324/754 |
| 5,311,120 | 5/1994 | Bartholomew | 324/754 |
| 5,396,186 | 3/1995 | Scheutzow | 324/754 |
| 5,572,144 | 11/1996 | Davidson et al. | 324/755 |
| 5,663,655 | 9/1997 | Johnston et al. | 324/761 |
| 5,670,884 | 9/1997 | Kodama | 324/538 |
| 5,670,888 | 9/1997 | Cheng | 324/754 |
| 5,748,007 | 5/1998 | Gaschke | 324/755 |
| 5,777,480 | 7/1998 | Hatagishi et al. | 324/538 |
| 5,831,438 | 11/1998 | Okura | 324/538 |
| 5,889,407 | * 3/1999 | Nucci | 324/754 |
| 6,066,957 | * 5/2000 | Van Loan et al. | 324/758 |
| 6,084,422 | * 2/2000 | Bartholomew | 324/761 |
| 6,107,813 | * 8/2000 | Sinsheimer et al. | 324/758 |
| 6,118,292 | * 9/2000 | Antonello et al. | 324/758 |

FOREIGN PATENT DOCUMENTS

| | | |
|---|---|---|
| 2098813 | 11/1982 | (GB) . |
| 10-197590 | 7/1998 | (JP) . |

OTHER PUBLICATIONS

Japanese Utility Model No. 63–48164 (04/88), Japanese Utility Model No. 58–39574 (09/81) Japanese Patent Office Action dated Dec. 5, 2000.

* cited by examiner

Primary Examiner—Glenn W. Brown
Assistant Examiner—Wasseem H. Hamdan
(74) Attorney, Agent, or Firm—Robert E. Bushnell, Esq.

(57) ABSTRACT

A unified test system for testing the performance of a printed circuit board assembly, and a test method using the same. A masking board and a printed circuit board assembly are loaded onto a pin board from which test process connection pins having different height project. The test process connection pins, a power input connector and a signal interface connector are connected with the printed circuit board assembly and pins installed on the printed circuit board assembly. Thereafter, in-circuit-test signals are generated to test the printed circuit board assembly. Only function-circuit-test connection pins among the test process connection pins are connected with the printed circuit board assembly, and functions between the printed circuit board assembly and a head disk assembly are tested. Finally, results of the in-circuit-test process and the function-circuit-test process are displayed.

20 Claims, 13 Drawing Sheets

UNIFIED TEST SYSTEM AND METHOD FOR TESTING PRINTED CIRCUIT BOARDS

CLAIM OF PRIORITY

This application makes reference to, incorporates the same herein, and claims all benefits accruing under 35 U.S.C. § 119 from an application entitled UNIFIED TEST SYSTEM AND TEST METHOD USING THE SAME earlier filed in the Korean Industrial Property Office on Oct. 13, 1998 and there duly assigned Ser. No. 42751/1998, a copy of which is annexed hereto.

BACKGROUND OF THE INVENTION

1. Technical Field

The present invention relates to a hard disk drive manufacturing process, and more particularly, to a unified test system for testing the performance of a printed circuit board assembly and a test method using the same.

2. Related Art

Among processes for manufacturing a hard disk drive used as an auxiliary storage device of a computer, an in-circuit testing (ICT) process and a function circuit testing (FCT) process are used to test the performance of a printed circuit board assembly (PCBA).

In the in-circuit testing process, the soldering quality of a printed circuit board assembly produced through a surface mounting device (SMD) process and the quality of each circuit element are tested in a unit of parts to detect defects, for example, whether any parts are shorted or wrongly inserted. In the function circuit testing process, the printed circuit board assembly is connected, after the in-circuit testing process, to a head disk assembly (HDA) to test functions between the printed circuit board assembly and the head disk assembly and a read/write capability.

Generally, hard disk drive manufacturers separately implement the above two processes, so it takes a long time to test the performance of the printed circuit board assembly. Further, since the printed circuit board assembly and the head disk assembly should manually be connected with each other to implement the in-circuit testing and function circuit testing processes, there are required many workers, and productivity may be lowered due to manual work. Moreover, since the head disk assembly connected to test the performance of the printed circuit board assembly may be damaged due to a defective printed circuit board assembly or manual work, an economic loss may be incurred.

I have found that inefficient test methods and test devices can be extremely inconvenient. Efforts have been made to improve testing methods and devices.

Exemplars of recent efforts in the art include U.S. Pat. No. 5,777,480 for DEVICE FOR TESTING CONNECTOR HAVING MULTIPLE TERMINALS THEREIN issued to Hatagishi et al.; U.S. Pat. No. 5,831,438 for DEVICE FOR TESTING A CONNECTOR HAVING MULTIPLE TERMINALS THEREIN issued to Okura; U.S. Pat. No. 5,748,007 for UNIVERSAL TEST AND BURN-IN SOCKET ADAPTABLE TO VARYING IC MODULE THICKNESS issued to Gaschke; U.S. Pat. No. 4,626,780 for TRI-AXIS AUTOMATED TEST SYSTEM FOR PRINTED CIRCUIT BOARDS issued to Powers et al.; U.S. Pat. No. 5,214,374 for DUAL LEVEL TEST FIXTURE issued to St. Onge; U.S. Pat. No. 5,283,605 for DEVICE FOR TESTING CONTACTING AND/OR WIRING OF SOCKETS ON A CIRCUIT BOARD issued to Lang-Dahlke; U.S. Pat. No. 5,572,144 for TEST JIG AND METHOD FOR PROBING A PRINTED CIRCUIT BOARD issued to Davidson et al.; U.S. Pat. No. 5,663,655 for ESD PROTECTION FOR UNIVERSAL GRID TYPE TEST FIXTURES issued to Johnston et al.; U.S. Pat. No. 5,670,884 for CONNECTOR TESTING DEVICE issued to Kodama; and U.S. Pat. No. 5,670,888 for METHOD FOR TRANSPORTING AND TESTING WAFERS issued to Cheng.

While these recent efforts provide advantages, I note that they fail to adequately provide an improved and convenient unified test system and test method.

SUMMARY OF THE INVENTION

It is therefore an object of the present invention to provide a unified test system and a test method using the same which can save the cost necessary for a test and a working time by unifying processes for testing the performance of a printed circuit board assembly of a hard disk drive.

It is another object of the present invention to provide a unified test system and a test method using the same which can improve the yield of production by unifying and automating processes for testing the performance of a printed circuit board assembly of a hard disk drive.

In accordance with one aspect of the present invention, there is provided a unified test system for testing the performance of a printed circuit board assembly, including a pin board from which test process connection pins having different height project, wherein the pin board is mounted on a main frame; a masking board at which holes are formed so that the connection pins can be connected with the printed circuit board assembly loaded thereon by passing through the holes upon loading onto the pin board; a first frame which is supported by first guide rods installed upright at the main frame and has a first cylinder installed at its upper part and driven up and down; a second frame having a power input connector and a signal interface connector installed at its lower part, wherein the second frame moves along the first guide rods when the first cylinder is driven to connect the ii connection pins with the printed circuit board assembly by pressing the printed circuit board assembly downward; a second cylinder installed at the upper part of the second frame and driven back and forth; and a third frame having at its upper part a head disk assembly connected by pins with the printed circuit board assembly when the second frame has moved downward, wherein the third frame moves along second guide rods when the second cylinder is driven to connect the power input connector and the signal interface connector with power input pins and signal interface pins, respectively, of the printed circuit board assembly.

In accordance with another aspect of the present invention, a unified test process for testing the performance of a printed circuit board assembly includes the steps of loading a masking board and the printed circuit board assembly onto a pin board from which test process connection pins having different height project; connecting the test process connection pins, a power input connector and a signal interface connector with the printed circuit board assembly and pins installed on the printed circuit board assembly; generating in-circuit-test signals to test the printed circuit board assembly; connecting only function-circuit-test connection pins among the test process connection pins with the printed circuit board assembly, and testing functions between the printed circuit board assembly and a head disk assembly; and displaying results of testing the printed circuit board assembly and the functions.

To achieve these and other objects in accordance with the principles of the present invention, as embodied and broadly described, the present invention provides an apparatus testing performance of a printed circuit board, said apparatus comprising: a base being located at a lower surface of said apparatus; a test unit having a head disk assembly and being operationally coupled to said apparatus; a first plate being supported by first guide rods installed at said base, being movable along a first path of conveyance toward and away from said base, and having a plurality of disk connector pins operationally coupled with the head disk assembly; a pin board being installed at said base, being disposed between said base and said first plate, having a first plurality of connection pins projecting a first distance toward said first plate, and having a second plurality of connection pins projecting a second distance toward said first plate, said first distance being different from said second distance; a masking board being movably coupled to said pin board, being movable toward and away from said pin board, and being disposed between pin board and said first plate, said masking board receiving a printed circuit board assembly having power input pins and signal interface pins, said plurality of disk connector pins of said first plate projecting toward the printed circuit board assembly; a second plate being supported by second guide rods, being moveably coupled to said first plate, being movable along a second path of conveyance back and forth across said base, having a power input connector conveying power to said power input pins of the printed circuit board assembly, and having a signal interface connector conveying signals to and from said signal interface pins of the printed circuit board assembly; a first control unit being operationally coupled to said first plate and controlling movement of said first plate along said first path of conveyance, and being operationally coupled to said second plate and controlling movement of said second plate along said second path of conveyance, said first path of conveyance being different from said second path of conveyance; said first plate moving along said first path of conveyance connecting electrically said plurality of disk connector pins with the printed circuit board assembly, in accordance with said first control unit; said first plate moving a first predetermined distance along said first path of conveyance, pressing the printed circuit board assembly and said masking board toward said pin board, and connecting electrically said first plurality of connection pins with the printed circuit board assembly through said masking board, in accordance with said first control unit; said first plate moving a second predetermined distance along said first path of conveyance, pressing the printed circuit board assembly and said masking board toward said pin board, and connecting electrically said second plurality of connection pins with the printed circuit board assembly through said masking board, in accordance with said first control unit; and said second plate moving along said second path of conveyance, connecting said power input connector with said power input pins, and connecting said signal interface connector with said signal interface pins, in accordance with said first control unit.

To achieve these and other objects in accordance with the principles of the present invention, as embodied and broadly described, the present invention provides an apparatus testing a printed circuit board, said apparatus comprising: a pin board having a first plurality of test process connection pins projecting to a first height above said pin board, and having a second plurality of test process connection pins projecting to a second height taller than said first height above said pin board, said pin board being mounted to an upper surface of a base of said apparatus; a masking board having an upper surface receiving a printed circuit board assembly for tests, and having a lower surface disposed toward said pin board, said masking board forming a plurality of apertures, said masking board being movably coupled to said pin board, said first and second plurality of test process connection pins selectively connecting to the printed circuit board assembly through the plurality of apertures formed in said masking board when said masking board is pressed down toward said pin board, the printed circuit board assembly having power input pins receiving power and signal interface pins receiving and outputting signals; a first frame being supported by first guide rods installed at said base; a first transportation control unit being installed on said first frame; a second frame being supported by said first guide rods installed at said base, said second frame being disposed between said first frame and the printed circuit board assembly mounted on said masking board, said second frame being moved along said first guide rods down toward the printed circuit board assembly and up away from the printed circuit board assembly in accordance with said first transportation control unit; a second transportation control unit being installed on said second frame; a test unit having a head disk assembly and being operationally coupled to said apparatus; and a third frame having an upper surface and a lower surface, said upper surface of said third frame receiving said head disk assembly, said lower surface of said third frame having a plurality of disk connector pins projecting down toward the printed circuit board assembly and connecting electrically said head disk assembly to the printed circuit board assembly when said second frame moves down toward the printed circuit board assembly, said third frame moving along second guide rods across said upper surface of said base toward the printed circuit board assembly and away from the printed circuit board assembly in accordance with said second transportation control unit, said third frame having a power input connector and a signal interface connector, said power input connector conveying power to said power input pins and said signal interface connector receiving and outputting signals from and to said signal interface pins when said third frame moves toward the printed circuit board assembly in accordance with said second transportation control unit.

To achieve these and other objects in accordance with the principles of the present invention, as embodied and broadly described, the present invention provides an apparatus for testing performance of a printed circuit board, said apparatus comprising: a pin board having a first plurality of test process connection pins projecting to a first height above said pin board, and having a second plurality of test process connection pins projecting to a second height taller than said first height above said pin board, said pin board being mounted to an upper surface of a base of said apparatus; a masking board having an upper surface receiving a printed circuit board assembly for tests, and having a lower surface disposed toward said pin board, said masking board forming a plurality of apertures, said masking board being movably coupled to said pin board, said first and second plurality of test process connection pins selectively connecting to the printed circuit board assembly through the plurality of apertures formed in said masking board when said masking board is pressed down toward said pin board, the printed circuit board assembly having power input pins receiving power and signal interface pins receiving and outputting signals; a head disk assembly having a head suspended above a rotating disk; a first frame being supported by first guide rods installed at said base; a first transportation control unit being installed on said first frame; a second frame being supported by said first guide rods installed at said base, said second frame being disposed between said first frame and the printed circuit board assembly mounted on said masking board, said second frame being moved along said first guide rods down toward the printed circuit board assembly and up away from the printed circuit board assembly in accordance with said first transportation control unit; a second transportation control unit being installed on said second frame; a third frame being supported by said first guide rods installed at said base, said third frame being disposed between said second frame and the printed circuit board assembly, said third frame being moved along said first guide rods down toward the printed circuit board assembly and up away from the printed circuit board assembly in accordance with said second transportation control unit, said third frame having guide frames fixed to a lower part of said third frame; a fourth frame having a power input connector and a signal interface connector and having supporters supporting a horizontal member inserted along said guide frames of said third frame; a third transportation control unit installed on said fourth frame; and a fifth frame having an upper surface and a lower surface, said upper surface of said fifth frame receiving said head disk assembly, said lower surface of said fifth frame having a plurality of disk connector pins projecting down toward the printed circuit board assembly and connecting electrically said head disk assembly to the printed circuit board assembly when said third frame moves down toward the printed circuit board assembly, said fifth frame moving along second guide rods across said upper surface of said base toward the printed circuit board assembly and away from the printed circuit board assembly in accordance with said third transportation control unit, said fifth frame having a power input connector and a signal interface connector, said power input connector conveying power to said power input pins and said signal interface connector receiving and outputting signals from and to said signal interface pins when said fifth frame moves toward the printed circuit board assembly in accordance with said third transportation control unit.

To achieve these and other objects in accordance with the principles of the present invention, as embodied and broadly described, the present invention provides an apparatus testing a printed circuit board, said apparatus comprising: a pin board having a first plurality of test process connection pins projecting to a first height above said pin board, and having a second plurality of test process connection pins projecting to a second height taller than said first height above said pin board, said pin board being mounted to an upper surface of a base of said apparatus; a masking board having an upper surface receiving a printed circuit board assembly for tests, and having a lower surface disposed toward said pin board, said masking board forming a plurality of apertures, said masking board being movably coupled to said pin board, said first and second plurality of test process connection pins selectively connecting to the printed circuit board assembly through the plurality of apertures formed in said masking board when said masking board is pressed down toward said pin board; and springs supporting said lower surface of said masking board and absorbing shock generated when said masking board is pressed down to connect said first and second plurality of test process connection pins with the printed circuit board assembly.

To achieve these and other objects in accordance with the principles of the present invention, as embodied and broadly described, the present invention provides a method testing performance of a printed circuit board, said method comprising: loading a masking board and a printed circuit board assembly onto a pin board, said pin board having a plurality of test process connection pins of different height projecting from said pin board, said plurality of test process connection pins including first in-circuit-test pins having a first height and second function-circuit-test pins having a second height different from said first height; connecting said plurality of test process connection pins with the printed circuit board assembly, and connecting a power input connector and a signal interface connector with power input pins and signal interface pins of the printed circuit board assembly, respectively; generating in-circuit-test signals to test the printed circuit board assembly; disconnecting said first in-circuit-test pins having the first height from the printed circuit board and not disconnecting said second function-circuit-test pins having the second height; testing functions between the printed circuit board assembly and a head disk assembly having a head suspended adjacent to a rotating disk; and displaying results of testing of the printed circuit board assembly and said functions.

The present invention is more specifically described in the following paragraphs by reference to the drawings attached only by way of example. Other advantages and features will become apparent from the following description and from the claims.

BRIEF DESCRIPTION OF THE DRAWINGS

In the accompanying drawings, which are incorporated in and constitute a part of this specification, embodiments of the invention are illustrated, which, together with a general description of the invention given above, and the detailed description given below, serve to exemplify the principles of this invention.

DETAILED DESCRIPTION OF THE PREFERRED EMBODIMENT

While the present invention will be described more fully hereinafter with reference to the accompanying drawings, in which a preferred embodiment of the present invention is shown, it is to be understood at the outset of the description which follows that persons of skill in the appropriate arts may modify the invention here described while still achieving the favorable results of this invention. Accordingly, the description which follows is to be understood as being a broad, teaching disclosure directed to persons of skill in the appropriate arts, and not as limiting upon the present invention.

A preferred embodiment of the present invention will be described hereinbelow with reference to the accompanying drawings. In the following description, well known constructions or functions are not described in detail so as not to obscure the present invention.

Figure 1:
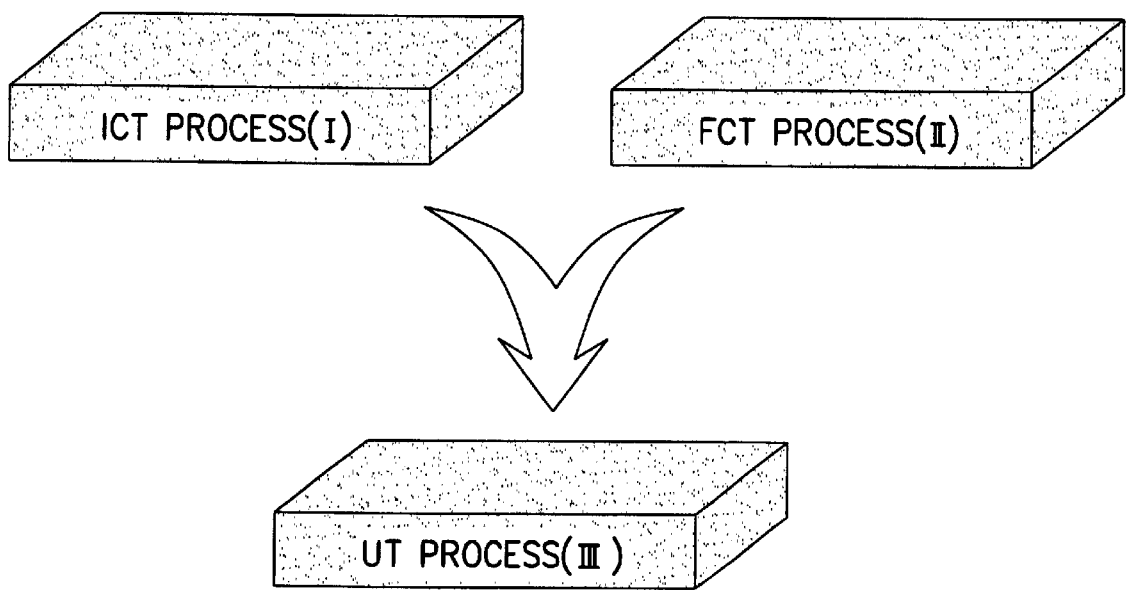
FIG. 1 illustrates the concept of a unified test process, according to the principles of the present invention.

Referring to FIG. 1, an in-circuit testing (ICT) process and a function circuit testing (FCT) process which have separately been implemented by hard disk drive manufacturers are unified as a unified test (UT) process using a unified test system (UTS) according to the present invention.

Figure 2:
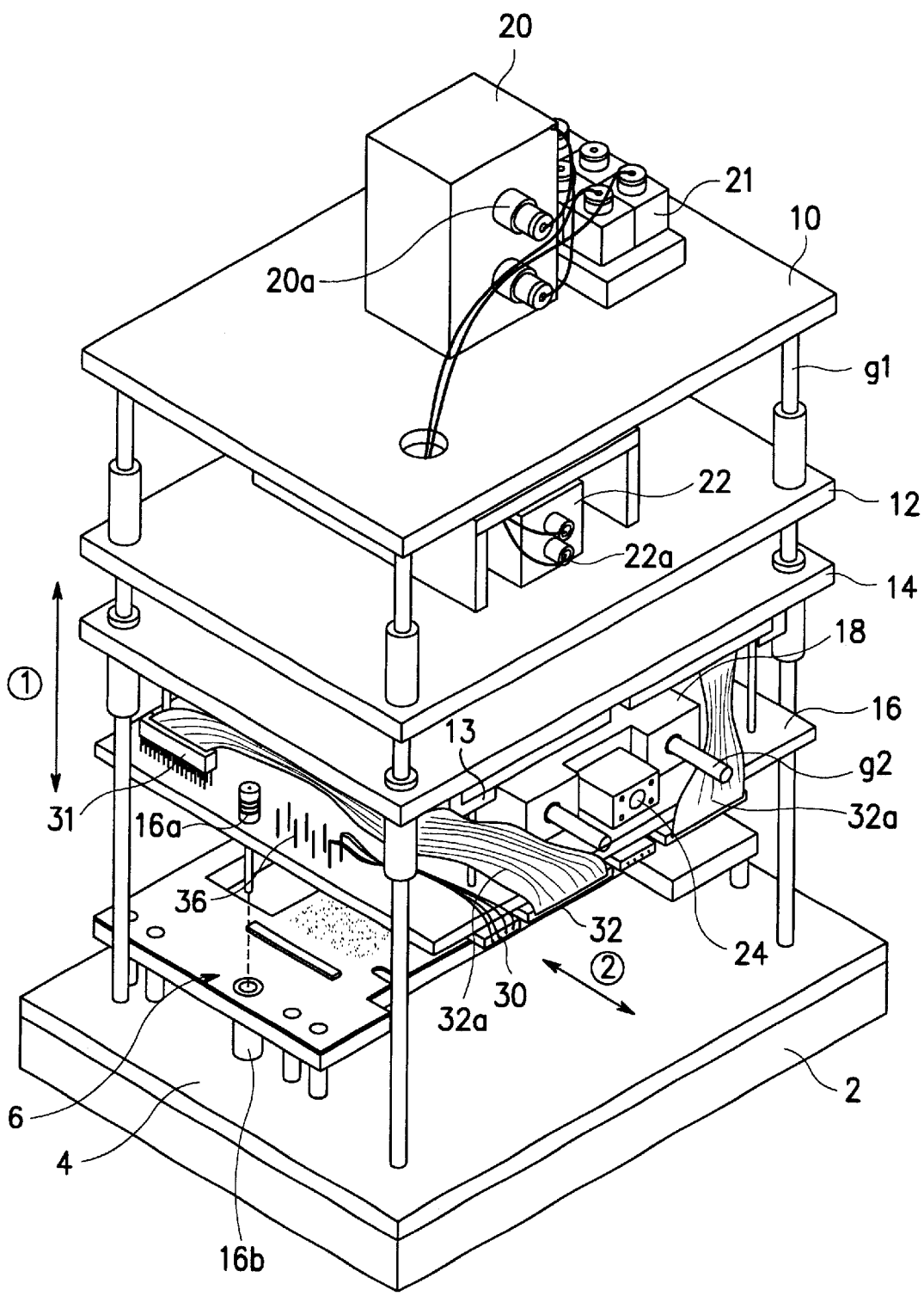
FIG. 2 is a perspective view of the unified test system, according to the principles of the present invention.

The structure of the unified test system will now be described. Referring to FIG. 2, a first 8 air cylinder 20 is positioned at the center of the upper part of a first plate-type frame 10 supported by first guide rods g1. A second air cylinder 22 is positioned at the center of the upper part of a second plate-type frame 12 which moves up and down as indicated by an arrow (1) along the first guide rods g1 by the driving of the first air cylinder 20. A third plate-type frame 14 moves up and down along the first guide rods g1 by the driving of the second air cylinder 22. A third air cylinder 24 which can be drawn from or put into the lower part of the third frame 14 along guide frames 13 fixed to both sides thereof is mounted at the upper part of a fourth plate-type frame 16. A fifth plate-type frame 18 mounted on the fourth frame 16 moves back and forth as indicated by an arrow (2) along second guide rods g2 by the driving the third air cylinder 24.

The first frame 10 is supported by the first guide rods g1 installed upright at the four corners of a pin board 4 mounted on a main frame 2. The main frame 2 can also be referred to as a base 2. The second, third and fourth frames 12, 14 and 16 move up and down by driving of the first and second air cylinders 20 and 22, and the fifth frame 18 moves back and forth along the second guide rods g2 by driving of the third air cylinder 24. That is, the first, second and third air cylinders 20, 22 and 24 shift the second, third, fourth and fifth frames 12, 14, 16 and 18 by the air pressure of their air hoses. The air pressure is manually controlled by air valves 20a and 22a fixed to each air cylinder. A pair of solenoid valves 21 for controlling the amount of air flowing into the cylinder or flowing therefrom is installed at one side of the first air cylinder 20 by a number corresponding to the number of the air cylinders. That is, the pair of solenoid valves designates an air inflow solenoid value and an air outflow solenoid value necessary for the driving of each air cylinder. The solenoid valves 21 are turned ON or OFF by a controller (44 shown in FIG. 8) which will be described later on.

Figure 3:
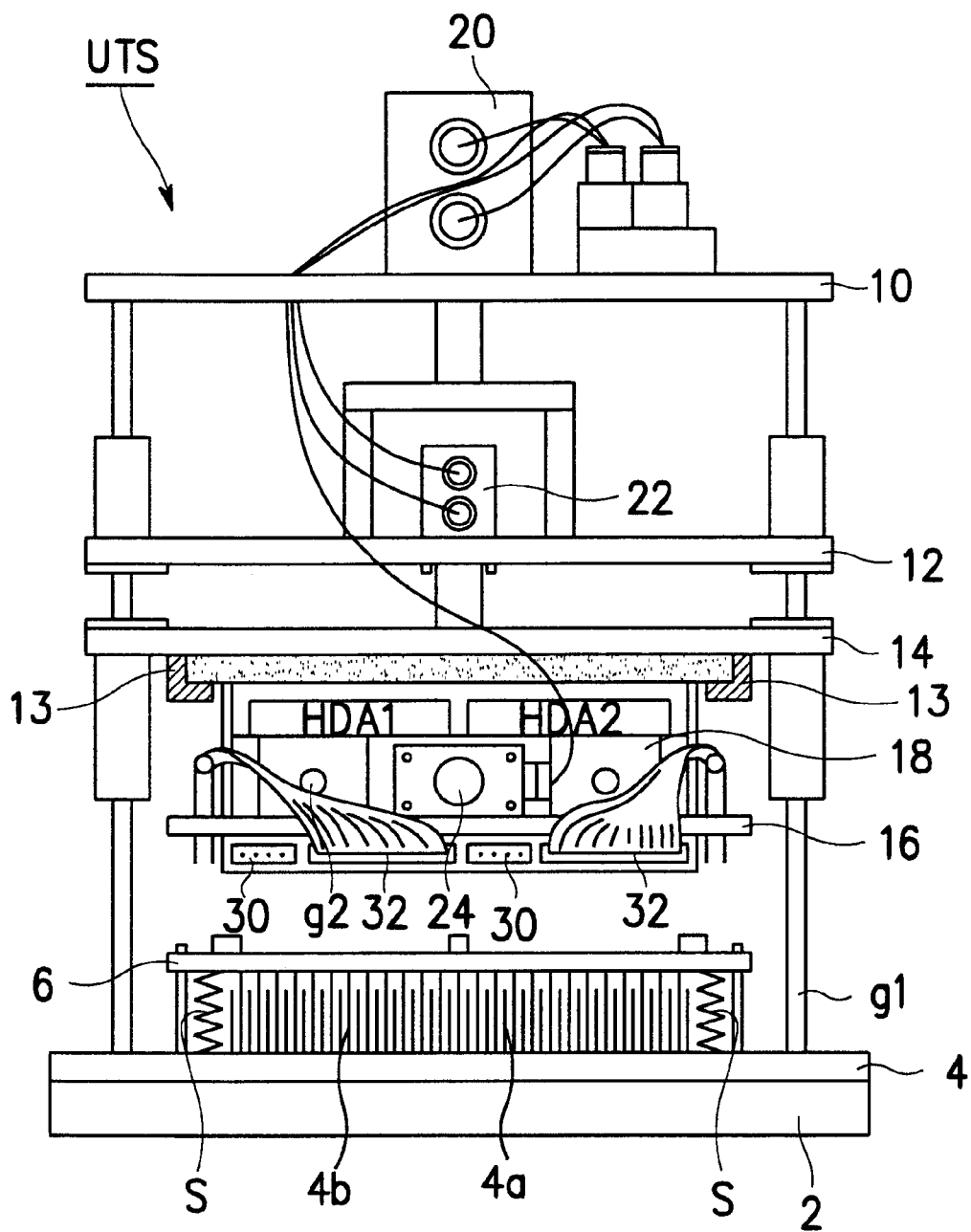
FIG. 3 is a front view of the unified test system, according to the principles of the present invention.
Figure 4:
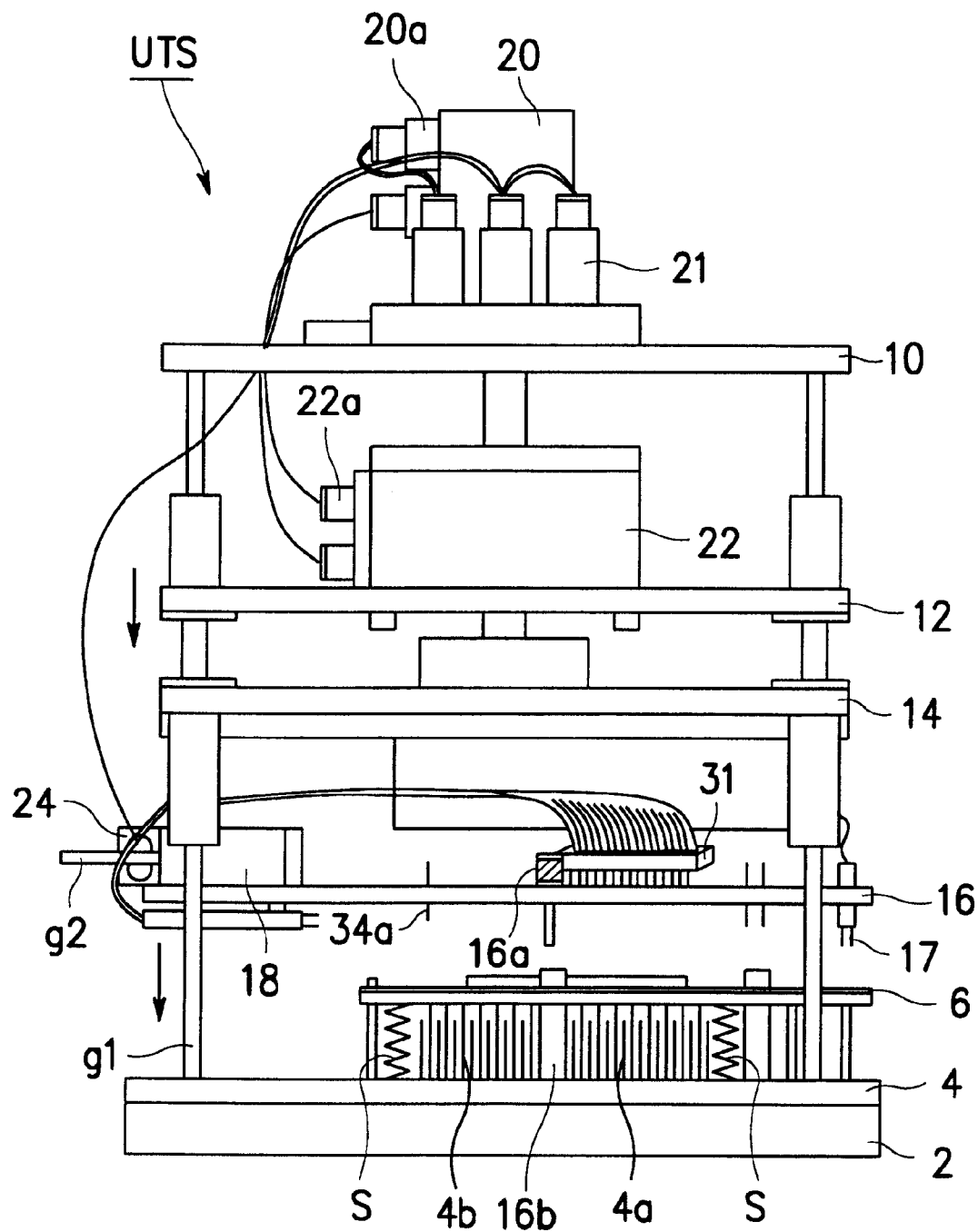
FIG. 4 is a side view of the unified test system, according to the principles of the present invention.
Figure 5:
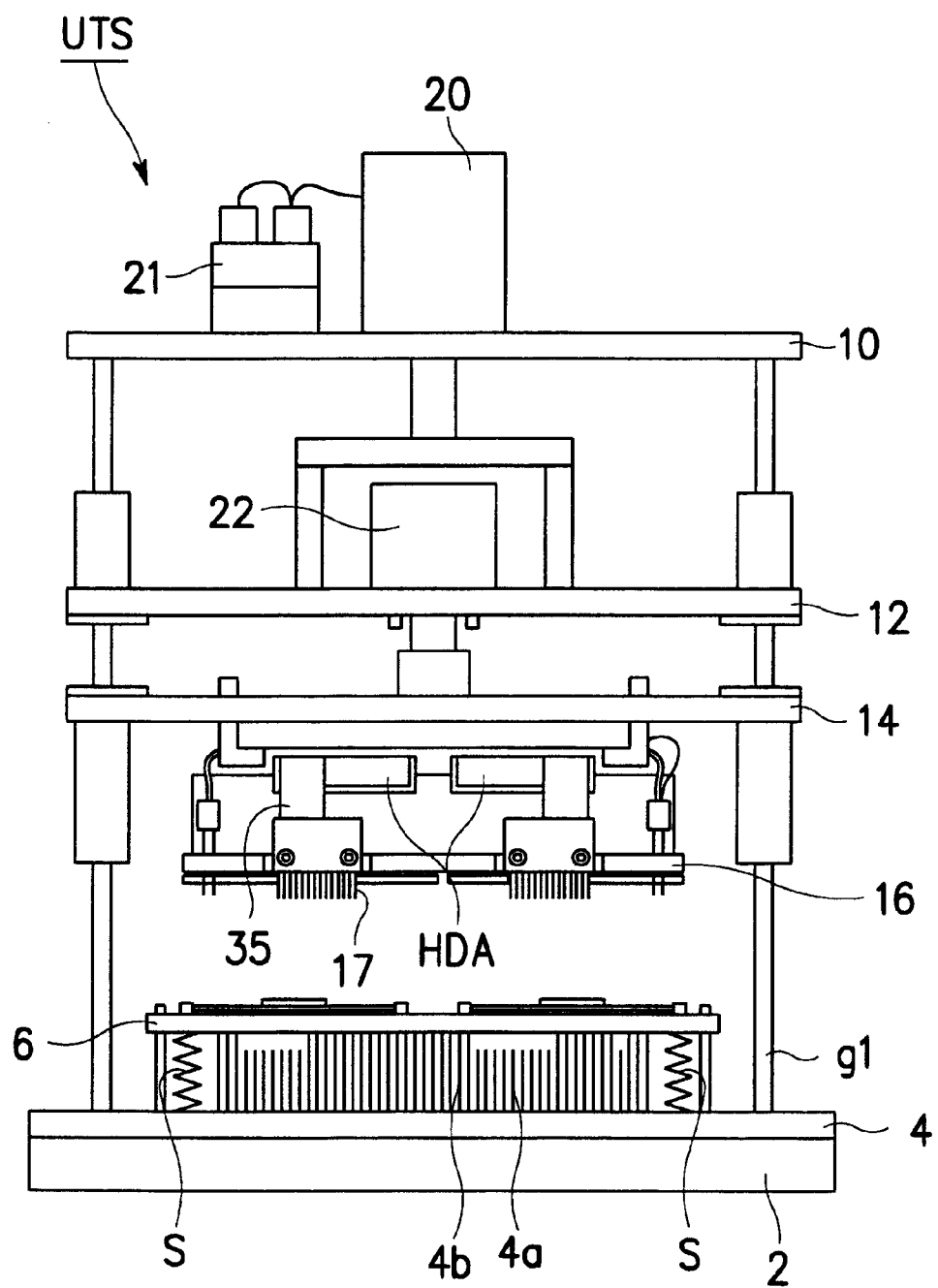
FIG. 5 is rear view of the unified test system, according to the principles of the present invention.
Figure 7:
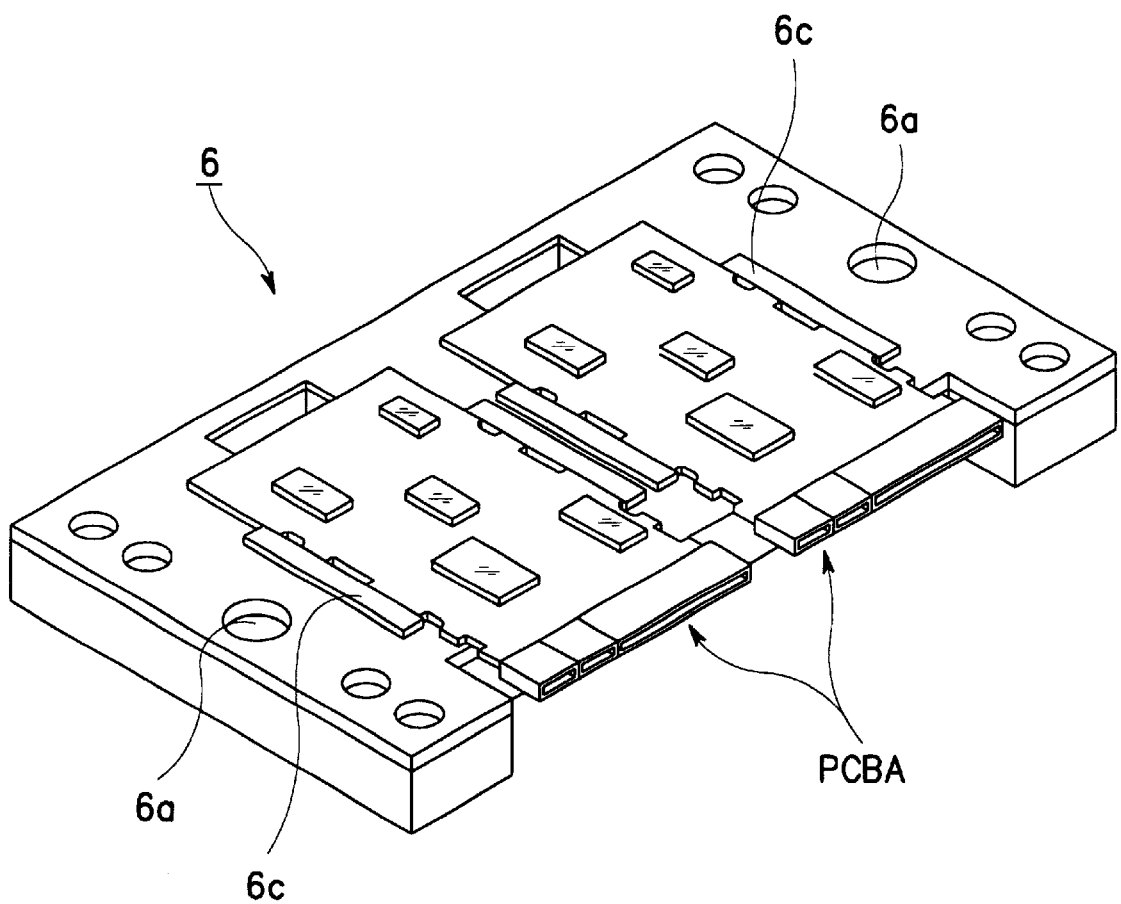
FIG. 7 is a perspective view illustrating a printed circuit board assembly loaded onto the masking board shown in FIG. 6, according to the principles of the present invention.

Meanwhile, the pin board 4 is in contact with the main frame 2. A masking board 6 is loaded onto the pin board 4. After an assembly process, printed circuit board assemblies are loaded onto the upper part of the masking board 6 as shown in FIG. 7. A plurality of connection pins 4a and 4b are situated at the center of the upper part of the pin board 4 as illustrated in FIGS. 3, 4 and 5. To keep the balance of the masking board 6 while the fourth frame 16 moves up and down, cylinders 16b are installed at the right and left sides of the masking board 6. A plurality of holes are formed on the masking board 6 so that the connection pins 4a and 4b positioned on the pin board 4 can pass through holes formed on the printed circuit board assemblies through them. The connection pins 4a and 4b are different in height as illustrated in FIGS. 3, 4 and 5, to perform both the in-circuit testing process and the function circuit testing process using the unified test system. In the following description, the connection pins having lower height will be referred to as the in-circuit testing process connection pin 4a, and the other connection pins the function circuit testing process connection pin 4b. Compression coil springs S are installed on the pin board 4 as indicated in FIG. 4 to absorb shock generated when connection pins 17 and 34a formed at the lower part of the fourth frame 16 are connected with pin connectors or the cylinders 16b installed on the pin board 4 while the fourth frame 16 moves downward. The compression coil springs S differ in diameters of their both ends. As illustrated in FIG. 4, the upper short pins 34a are installed at the lower part of the fourth frame 16. Lower short pins 34b (not shown) are installed at a position connected with the upper short pins 34a when the fourth frame 16 moves downward. The upper and lower short pins 34a and 34b are connected with each other when the connection pins 4a and 4b installed on the pin board 4 pass through the holes formed on the masking board 6 and the printed circuit board assembly while the fourth frame 16 moves downward. The controller 44 shown in FIG. 8 senses that the fourth frame 16 moves downward by a prescribed height when the upper and lower short pins 34a and 34b are connected with each other.

The first air cylinder 20 with the air valves 20a is installed at the center of the upper part of the first frame 10. Three pairs of solenoid valves 21 are installed at one side of the first air cylinder 20. The known air valves 20a and 22a are used for manually controlling the air pressure supplied to the first and second air cylinders 20 and 22, respectively. The solenoid valves 21 are turned ON or OFF by the controller 44 for controlling the overall operation of the unified test system. Therefore, the second frame 12 moves downward by the first air cylinder 20 driven by the air pressure, and the third and fourth frames 14 and 16 also move downward by the driving of the second air cylinder 22. If the fourth frame 16 moves downward by a prescribed height, the pins 17 and 34a formed at its lower part can be connected with pin connectors of the printed circuit board assemblies loaded onto the masking board 6 and the pins 34b formed on the pin board 4. Referring back to FIG. 2, the fifth frame 18 installed between the third and fourth frames 14 and 16 moves back and forth as indicated by the arrow (2) along the second guide rods g2 by the driving of the third air cylinder 24. Two head disk assemblies (HDAs) are mounted on the fifth frame 18 as illustrated in FIG. 3. Flexible printed circuit boards (PCBs) 35 connected with spindle motors of the head disk assemblies are electrically connected with spindle motor driving pins 17 as shown in FIG. 5. On the other hand, a 4-pin connector 30 which is a power input connector and a 40-pin connector 32 which is a signal interface connector are situated at the both sides of the lower part of the fourth frame 16 as shown in FIG. 2. The connectors 30 and 32 move together with the fifth frame 18. If the third air cylinder 24 is driven after the second, third and fourth frames 12, 14 and 16 have moved downward by the driving of the first and second air cylinders 20 and 22, the 4-pin connector 30 and the 40-pin connector 32 can respectively be connected with 4 pins and 40 pins of the printed circuit board assembly loaded onto the masking board 6 since the fifth frame move backward.

Fixing pins 16a are installed at the both sides of the upper part of the fourth frame 16 so that the in-circuit testing process and function circuit testing process connection pins 4a and 4b can accurately pass through the holes formed on the printed circuit board assembly when the fourth frame 16 moves downward. The fixing pins 16a are inserted into the hole of the cylinder 16b installed on the pin board 4 when the fourth frame 16 moves downward to fix the masking board 6. A plurality of connection pins 36 are installed beside the fixing pins 16a. The 4-pin connector 30 is connected by cables with the connection pins 36 installed at the side part of the fourth frame 16. The 40-pin connector 32 is connected by a plate cable 32a with a pin connector 31 installed at the side part of the fourth frame 16.

Figures 6A, 6B:
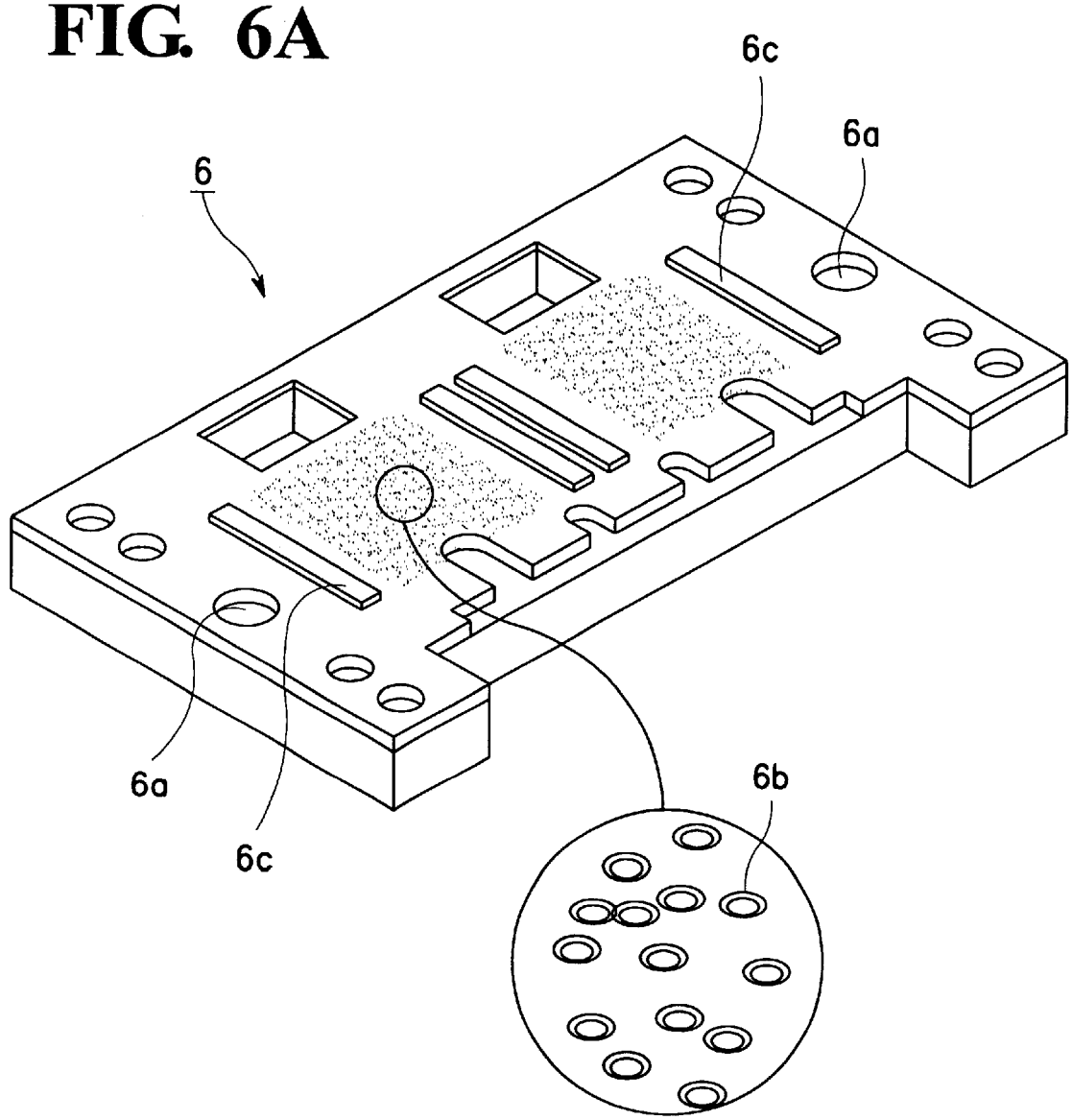
FIG. 6 is a perspective view of a masking board loaded onto a pin board of the unified test system, according to the principles of the present invention.

FIG. 6 is a perspective view of the masking board 6 loaded onto the pin board 4. FIG. 7 illustrates the printed circuit board assembly loaded onto the masking board 6.

Referring to FIG. 6, holes 6a keep the position of the masking board 6, and holes 6b cause the connection pins 4a and 4b to pass through holes 6b. Guides 6c are fixed to the both sides of the holes 6b to accurately load the printed circuit board assembly onto the masking board 6. Hence, the worker can insert the printed circuit board assembly into the slits of the guides 6c.

Figure 8:
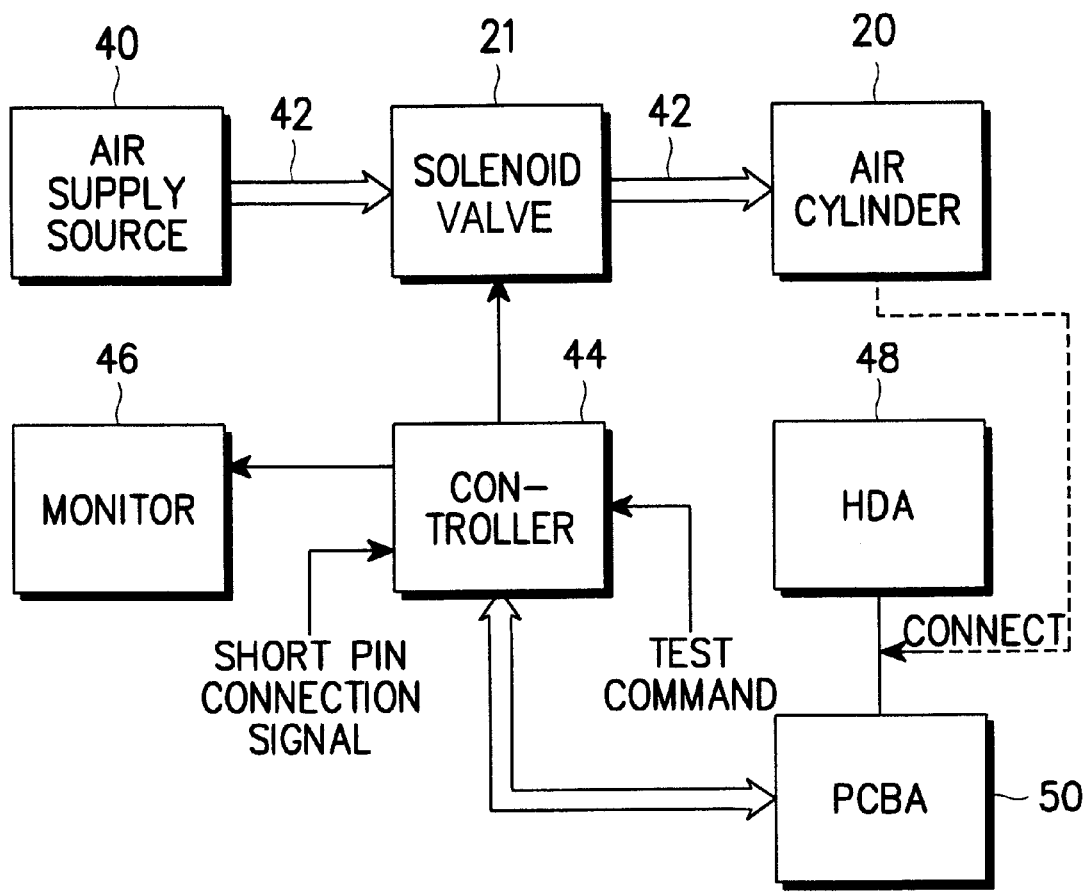
FIG. 8 is a block diagram of a peripheral circuit of the unified test system, according to the principles of the present invention.

A block diagram of a peripheral circuit of the unified test system is illustrated in FIG. 8. An air supply source 40 supplies air of given pressure through an air hose 42. The air hose 42 is connected with an air cylinder 20 through a solenoid valve 21. The air cylinder 20 designates all the first, second and third air cylinders described previously. The solenoid valve 21 is turned ON or OFF by an ON/OFF control signal given from the controller 44. Therefore, the air cylinder 20 is driven up and down or back and forth by the air pressure flowing thereinto or flowing therefrom when the solenoid valve 21 is turned ON or OFF. The controller 44 includes a memory consisting of a read only memory (ROM) in which a control program for controlling the operation of the unified test system is stored and a random access memory (RAM) for temporarily storing data generated during control operation. The controller 44 generates test signals for testing the performance of the printed circuit board assembly 50 on the basis of the control program stored in the memory and receives response signals for the test signals. A monitor 46 displays data for the response signals given from the controller 44. Then the worker can decide whether the printed circuit board assembly 50 is passed or not by the result values displayed on the monitor 46.

Figure 9:
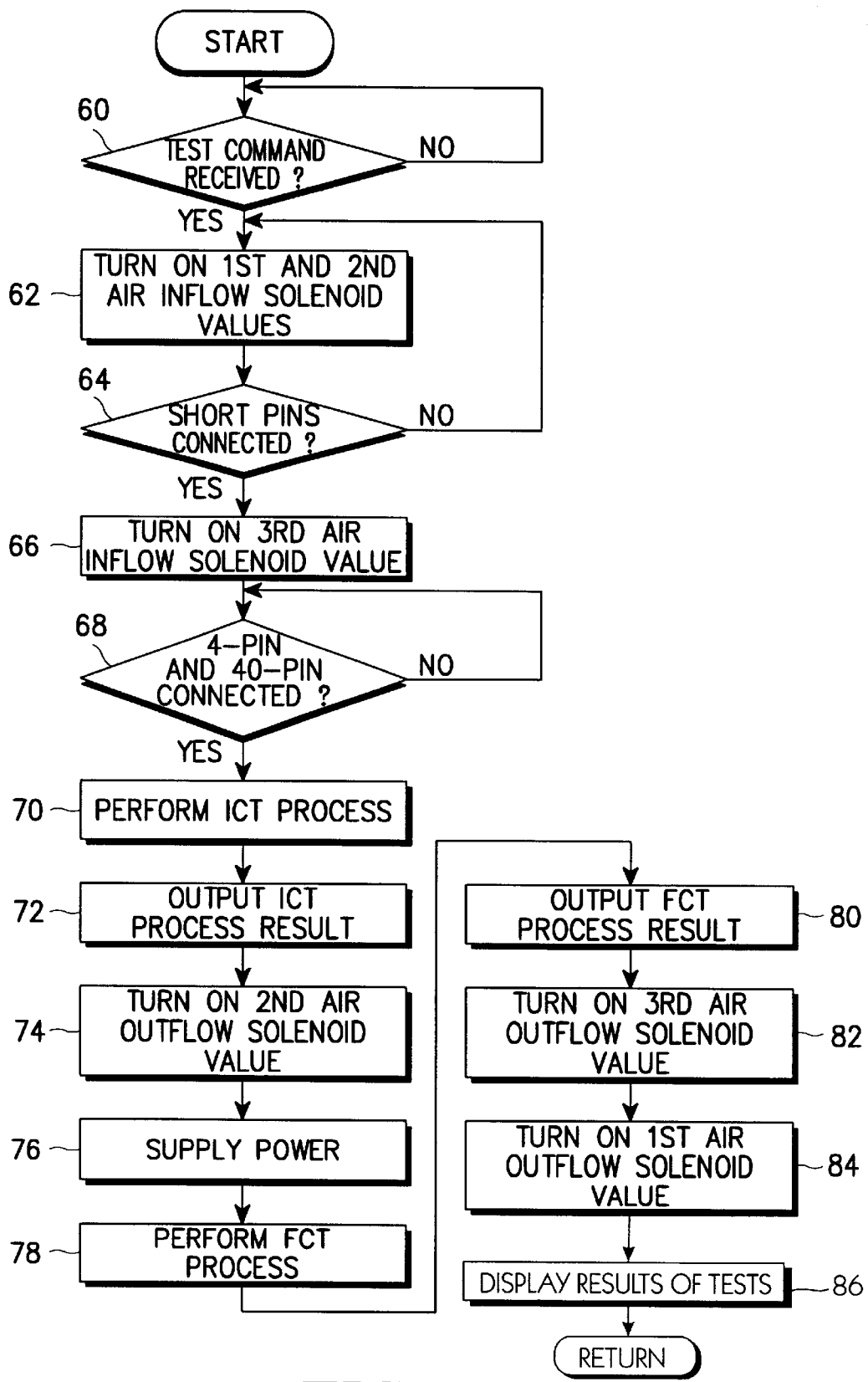
FIG. 9 is a flow chart illustrating a unified test process, according to the principles of the present invention.
Figure 10A:
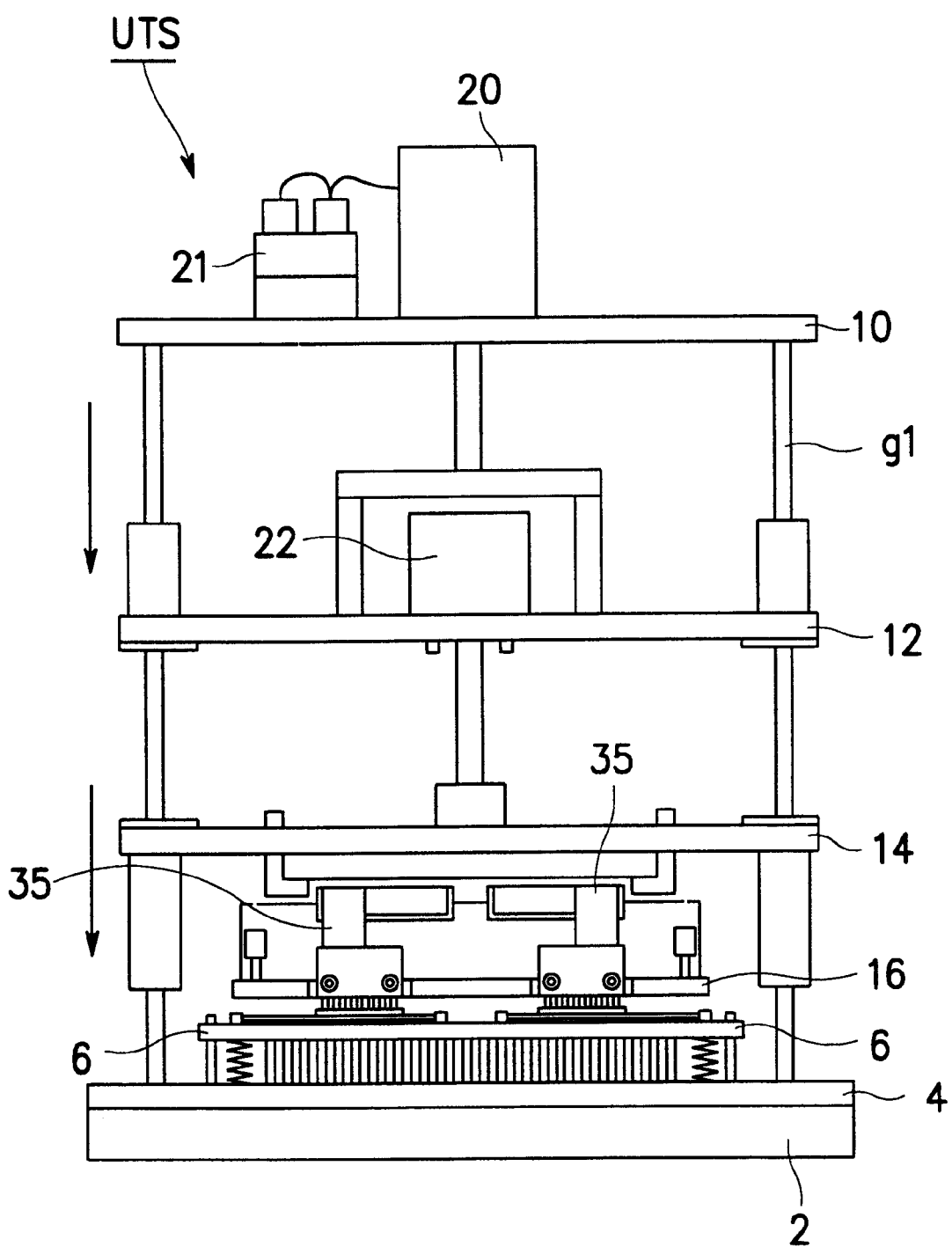
FIGS. 10A, 10B, 10C and 10D are exemplary diagrams illustrating the driving states of the unified test system during the execution of the unified test process, according to the principles of the present invention.

For the unified test process, the worker inserts the two printed circuit board assemblies 50 into the slits of the guides 6c fixed to the masking board 6 as illustrated in FIG. 7. It is preferable to previously load the masking board 6 onto the pin board 4 in order to speed up the test process. As shown in FIG. 9, if the worker inputs a test command, for example, if he or she turns ON a start switch, the controller 44 proceeds to step 62 in response to the test command at step 60. At step 62, the controller 44 turns ON first and second air inflow solenoid valves 21 so that air can flow into the first and second air cylinders 20 and 22. Then the second frame 12 moves downward by the driving of the first air cylinder 20, and third and fourth frames 14 and 16 also move downward by the driving of the second air cylinder 22, as indicated by arrows in FIG. 10A. The controller 44 checks at step 64 whether the short pins 34a and 34b have been connected with each other by examining a logic level value of a short pin connection signal received when they are connected with each other.

Figure 10B:
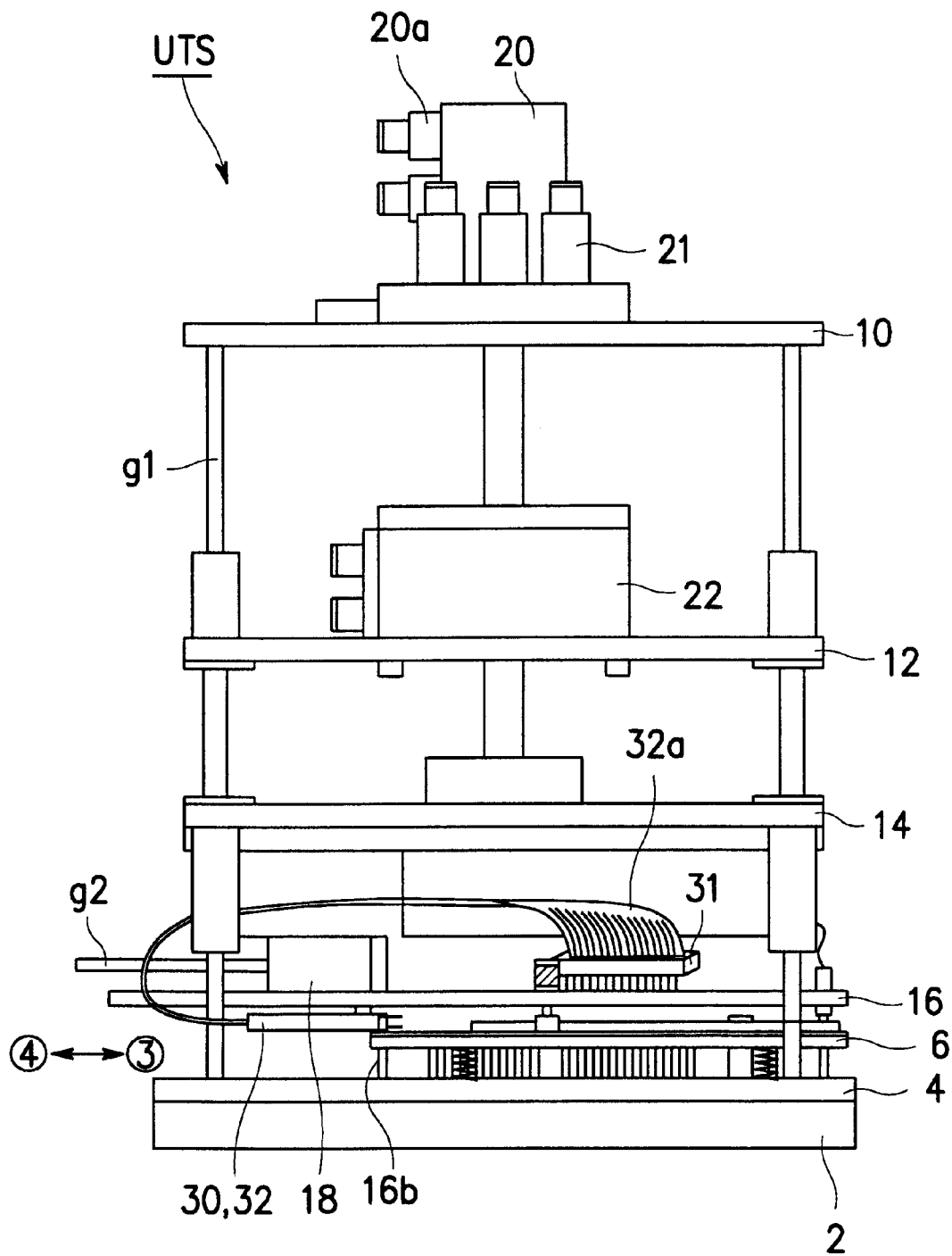

If the short pins 34a and 34b have been connected, the controller 44 stops driving the first and second air cylinders 20 and 22 and turns ON a third air inflow solenoid valve at step 66. Then s air flows into the third air cylinder 24 and the fifth frame 18 moves in the direction of an arrow (3) along the second guide rods g2 as illustrated in FIG. 10B. If the fifth frame 18 is shifted, the 4 pins and 40 pins of the printed circuit board assembly 50 are respectively connected with the 4-pin connector 30 and the 40-pin connector 32 mounted at the lower part of the fifth frame 18. The connector 30 is used for providing power. The controller 44 checks at step 68 whether the 4-pin connector 30 and the 40-pin connector 32 have been connected by checking response signals for signals inputted through the connectors 30 and 32. If they have been connected, the controller 44 turns OFF the third air inflow solenoid valve to stop driving the third air cylinder 24.

By the driving of the first and second air cylinders 20 and 22, both the in-circuit testing process connection pins 4a and the function circuit testing process connection pins 4b mounted on the pin board 4 come in contact with the printed circuit board assembly 50. The 40-pin connector 32 connected with the controller 44 is connected with the 40 pins by the driving of the third air cylinder 24. Therefore, the pins for the in-circuit testing process haven been connected.

If the pins for the in-circuit testing process have been connected, the controller 44 performs the in-circuit testing process at step 70 and outputs the result ofthe in-circuit testing process through the monitor 46 at step 72. That is, the controller 44 applies a test signal through the in-circuit testing process connection pins 4a positioned on the pin board 4 to detect the defective state of each circuit element assembled on the printed circuit board assembly 50 and the soldering state thereof. The worker can confirm the defective state of each circuit element and the soldering state thereof by seeing the result displayed on the monitor 46.

Figures 10C, 10D:
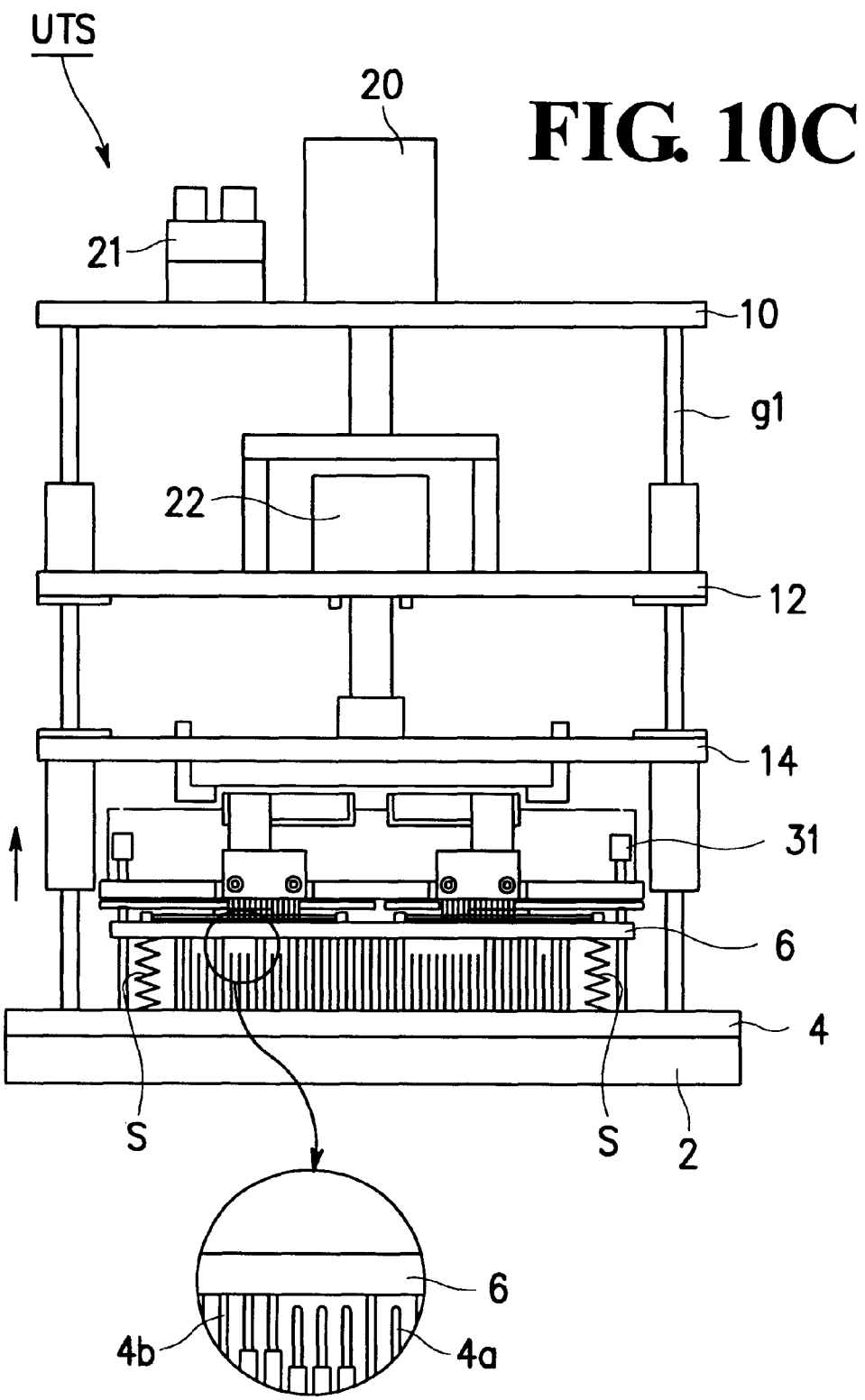

If the in-circuit testing process has been performed, the controller 44 turns ON a second air outflow solenoid valve at step 74. Then the third and fourth frames 14 and 16 move upward by the driving of the second air cylinder 22, and the in-circuit testing process connection pins 4a are separated from the masking board 6 as shown in FIG. 10C. Namely, only the function circuit testing process connection pins 4b are connected with the printed circuit board assembly 50.

If the pins for the function circuit testing process have been connected, the controller 44 supplies power to the head disk assembly and the printed circuit board assembly 50 at step 76. The controller 44 then performs the function circuit testing process by generating various test signals through the 40-pin connector 32 at step 78. That is, the controller 44 supplies test signals such as a track seek command and a data read/write command to the printed circuit board assembly 50 and receives response signals according to the operation between the head disk assembly (HDA) and the printed circuit board assembly (PCBA) 50, thereby testing the performance of the printed circuit board assembly 50. The controller 44 receiving the response signals for all the test signals outputs the result of the function circuit testing process through the monitor 46 at step 80.

The controller 44 turns ON a third air outflow solenoid valve at step 82. Then the third air cylinder 24 is driven and the fifth frame 18 moves backward along the second guide rods g2. As a result, the 40 pins are disconnected from the 40-pin connector 32. The controller 44 turns ON a first air outflow solenoid valve at step 84 to drive the first air cylinder 20. Thus the second, third and fourth frames 12, 14 and 16 move upward, that is, they are shifted to the original position. In FIG. 9, at step 86, the results of the tests are displayed on monitor 46 (shown in FIG. 8).

The worker can know the result of testing the performance of the printed circuit board assembly 50 by checking the results of the in-circuit testing process and the function circuit testing process through the monitor 46. It is judged whether each printed circuit board assembly is passed or not according to the test result. The worker loads the printed circuit board assembly which is in standby onto the masking board 6 and again operates the unified test system. Consequently, the in-circuit testing process and the function circuit testing process can rapidly be performed by one unified process.

Figure 11:
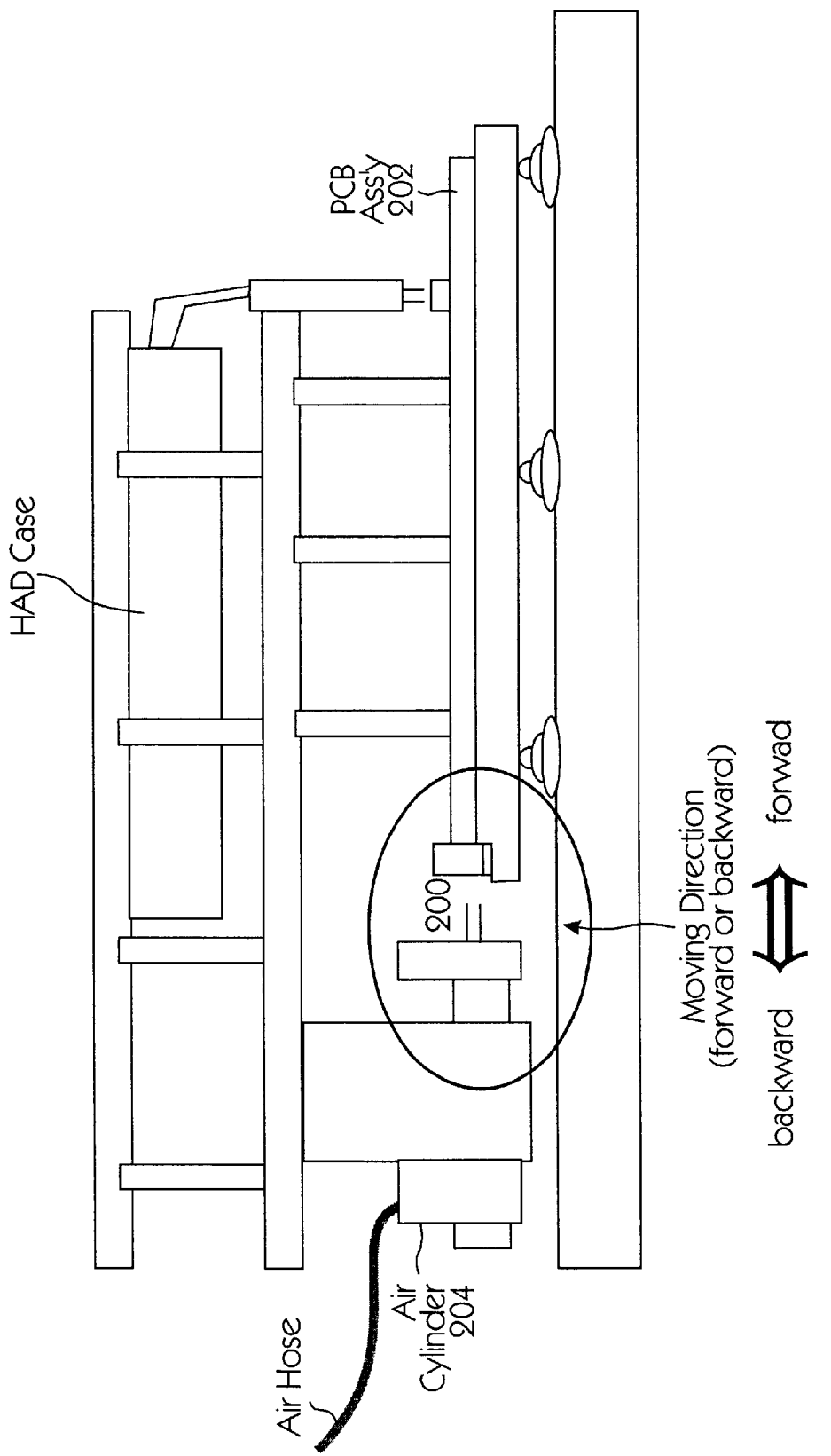
FIG. 11 is a diagram showing a method of connecting pins to a printed circuit board, in accordance with the principles of the present invention.

FIG. 11 shows a pin block 200 attached to an air cylinder 204. The pin block 200 is moved forward or backward by the air cylinder 204. When the pin block 200 is moved forward by the air cylinder 204, the pin block 200 comes into contact with connector pins of the printed circuit board assembly (PCBA) 202.

As described above, since the process for testing the performance of the printed circuit board assembly is performed by a single, automatic process, the cost and working time can be saved, improving the yield of production.

The monitor 46 shown in FIG. 8 can be a cathode ray tube, a liquid crystal display, a gas-plasma display, a light emitting diode display, an electro-luminescent display, a field emission display, or other type of display device.

While the invention has been shown and described with reference to certain preferred embodiments thereof, it will be understood that the present invention should not be limited to the specific embodiments illustrated above. For example, the frames 12, 14, 16, and 18 may be shifted by using one or more oil pressure cylinders instead of using air cylinders 20, 22, and 24. Or, the frames 12, 14, 16, and 18 may be shifted by using one or more electric motors with gears instead of using air cylinders 20, 22, and 24. In addition, the two air cylinders 20 and 22 for shifting the frames up and down may use one driving cylinder instead of using two cylinders. All of the aforementioned air cylinders, oil pressure cylinders, and electric motors can be considered transportation control units.

While the present invention has been illustrated by the description of embodiments thereof, and while the embodiments have been described in considerable detail, it is not the intention of the applicant to restrict or in any way limit the scope of the appended claims to such detail. Additional advantages and modifications will readily appear to those skilled in the art. Therefore, the invention in its broader aspects is not limited to the specific details, representative apparatus and method, and illustrative examples shown and described. Accordingly, departures may be made from such details without departing from the spirit or scope of the applicant's general inventive concept.

What is claimed is:

1. An apparatus testing performance of a printed circuit board, said apparatus comprising:

a base being located at a lower surface of said apparatus;

a test unit having a head disk assembly and being operationally coupled to said apparatus;

a first plate being supported by first guide means installed at said base, being movable along a first path of conveyance toward and away from said base, and having a plurality of disk connector pins operationally coupled with the head disk assembly;

a pin board being installed at said base, being disposed between said base and said first plate, having a first plurality of connection pins projecting a first distance toward said first plate, and having a second plurality of connection pins projecting a second distance toward said first plate, said first distance being different from said second distance;

a masking board being movably coupled to said pin board, being movable toward and away from said pin board, and being disposed between said pin board and said first plate, said masking board receiving a printed circuit board assembly having power input pins and signal interface pins, said plurality of disk connector pins of said first plate projecting toward the printed circuit board assembly;

a second plate being supported by second guide means, being moveably coupled to said first plate, being movable along a second path of conveyance back and forth across said base, having a power input connector conveying power to said power input pins of the printed circuit board assembly, and having a signal interface connector conveying signals to and from said signal interface pins of the printed circuit board assembly;

a first control unit being operationally coupled to said first plate and controlling movement of said first plate along said first path of conveyance, and being operationally coupled to said second plate and controlling movement of said second plate along said second path of conveyance, said first path of conveyance being different from said second path of conveyance;

said first plate moving along said first path of conveyance connecting electrically said plurality of disk connector pins with the printed circuit board assembly, in accordance with said first control unit;

said first plate moving a first predetermined distance along said first path of conveyance, pressing the printed circuit board assembly and said masking board toward said pin board, and connecting electrically said first plurality of connection pins with the printed circuit board assembly through said masking board, in accordance with said first control unit;

said first plate moving a second predetermined distance along said first path of conveyance, pressing the printed circuit board assembly and said masking board toward said pin board, and connecting electrically said second plurality of connection pins with the printed circuit board assembly through said masking board, in accordance with said first control unit; and said second plate moving along said second path of conveyance, connecting said power input connector with said power input pins, and connecting said signal interface connector with said signal interface pins, in accordance with said first control unit.

2. The apparatus of claim 1, said first control unit further comprising at least one driving means driven by air pressure, said first and second plates being moved when said at least one driving means is driven by the air pressure.

3. The apparatus of claim 2, further comprising compression coil springs being installed on said pin board and differing in diameters of their ends to absorb shock generated when the printed circuit board assembly loaded onto said masking board is pressed toward said pin board.

4. The apparatus of claim 3, said first plurality of connection pins corresponding to in-circuit test process connection pins conveying electrical test signals during in-circuit testing, said second plurality of connection pins corresponding to function-circuit test process connection pins conveying electrical test signals during functional testing, and said second distance being more than said first distance.

5. The apparatus of claim 4, said masking board forming a plurality of holes being penetrated by said first and second plurality of connection pins when said first plate performs said pressing of the printed circuit board assembly and said masking board toward said pin board.

6. The apparatus of claim 5, said first path of conveyance corresponding to a vertically oriented path including an up direction away from the printed circuit board assembly and a down direction toward the printed circuit board assembly, and said second path of conveyance corresponding to a horizontally oriented path including a right direction and a left direction across said base toward and away from the printed circuit board assembly.

7. The apparatus of claim 1, said first control unit further comprising at least one driving means driven by oil pressure, said first and second plates being moved when said at least one driving means is driven by the oil pressure.

8. An apparatus testing a printed circuit board, said apparatus comprising:

a pin board having a first plurality of test process connection pins projecting to a first height above said pin board, and having a second plurality of test process connection pins projecting to a second height taller than said first height above said pin board, said pin board being mounted to an upper surface of a base of said apparatus;

a masking board having an upper surface receiving a printed circuit board assembly for tests, and having a lower surface disposed toward said pin board, said masking board forming a plurality of apertures, said masking board being movably coupled to said pin board, said first and second plurality of test process connection pins selectively connecting to the printed circuit board assembly through the plurality of apertures formed in said masking board when said masking board is pressed down toward said pin board, the printed circuit board assembly having power input pins receiving power and signal interface pins receiving and outputting signals;

a first frame being supported by first guide means installed at said base;

a first transportation control unit being installed on said first frame;

a second frame being supported by said first guide means installed at said base, said second frame being disposed between said first frame and the printed circuit board assembly mounted on said masking board, said second frame being moved along said first guide means down toward the printed circuit board assembly and up away from the printed circuit board assembly in accordance with said first transportation control unit;

a second transportation control unit being installed on said second frame;

a test unit having a head disk assembly and being operationally coupled to said apparatus; and a third frame having an upper surface and a lower surface, said upper surface of said third frame receiving said head disk assembly, said lower surface of said third frame having a plurality of disk connector pins projecting down toward the printed circuit board assembly and connecting electrically said head disk assembly to the printed circuit board assembly when said second frame moves down toward the printed circuit board assembly, said third frame moving along second guide means across said upper surface of said base toward the printed circuit board assembly and away from the printed circuit board assembly in accordance with said second transportation control unit, said third frame having a power input connector and a signal interface connector, said power input connector conveying power to said power input pins and said signal interface connector receiving and outputting signals from and to said signal interface pins when said third frame moves toward the printed circuit board assembly in accordance with said second transportation control unit.

9. The apparatus of claim 8, said first and second transportation control units further comprising first and second driving units, respectively, driven by air pressure, said second frame being moved when said first driving unit is driven by air pressure, said third frame being moved when said second driving unit is driven by air pressure.

10. The apparatus of claim 8, said first and second transportation control units further comprising first and second driving units, respectively, driven by oil pressure, said second frame being moved when said first driving unit is driven by oil pressure, said third frame being moved when said second driving unit is driven by oil pressure.

11. An apparatus for testing performance of a printed circuit board, said apparatus comprising:

a pin board having a first plurality of test process connection pins projecting to a first height above said pin board, and having a second plurality of test process connection pins projecting to a second height taller than said first height above said pin board, said pin board being mounted to an upper surface of a base of said apparatus;

a masking board having an upper surface receiving a printed circuit board assembly for tests, and having a lower surface disposed toward said pin board, said masking board forming a plurality of apertures, said masking board being movably coupled to said pin board, said first and second plurality of test process connection pins selectively connecting to the printed circuit board assembly through the plurality of apertures formed in said masking board when said masking board is pressed down toward said pin board, the printed circuit board assembly having power input pins receiving power and signal interface pins receiving and outputting signals;

a head disk assembly having a head suspended above a rotating disk;

a first frame being supported by first guide means installed at said base;

a first transportation control unit being installed on said first frame;

a second frame being supported by said first guide means installed at said base, said second frame being disposed between said first frame and the printed circuit board assembly mounted on said masking board, said second frame being moved along said first guide means down toward the printed circuit board assembly and up away from the printed circuit board assembly in accordance with said first transportation control unit;

a second transportation control unit being installed on said second frame;

a third frame being supported by said first guide means installed at said base, said third frame being disposed between said second frame and the printed circuit board assembly, said third frame being moved along said first guide means down toward the printed circuit board assembly and up away from the printed circuit board assembly in accordance with said second transportation control unit, said third frame having guide frames fixed to a lower part of said third frame;

a fourth frame having a power input connector and a signal interface connector and having a horizontal member inserted along said guide frames of said third frame;

a third transportation control unit installed on said fourth frame; and a fifth frame having an upper surface and a lower surface, said upper surface of said fifth frame receiving said head disk assembly, said lower surface of said fifth frame having a plurality of disk connector pins projecting down toward the printed circuit board assembly and connecting electrically said head disk assembly to the printed circuit board assembly when said third frame moves down toward the printed circuit board assembly, said fifth frame moving along second guide means across said upper surface of said base toward the printed circuit board assembly and away from the printed circuit board assembly in accordance with said third transportation control unit, said fifth frame having a power input connector and a signal interface connector, said power input connector conveying power to said power input pins and said signal interface connector receiving and outputting signals from and to said signal interface pins when said fifth frame moves toward the printed circuit board assembly in accordance with said third transportation control unit.

12. The apparatus of claim 11, said first, second, and third transportation control units incorporating driving units driven by air pressure.

13. An apparatus, comprising:

a base;

a test unit having a head disk assembly and being operationally coupled to said apparatus;

a first plate being supported by a first guide system installed at said base, being movable along a first path of conveyance, and having a plurality of disk connector pins operationally coupled with the head disk assembly;

a pin board being installed at said base, being disposed between said base and said first plate, having a first plurality of connection pins projecting a first distance toward said first plate, and having a second plurality of connection pins projecting a second distance toward said first plate, said first distance being different from said second distance;

a mounting unit receiving a printed circuit board assembly having power input pins and signal interface pins, said mounting unit being movably coupled between said pin board and said first plate, said plurality of disk connector pins of said first plate projecting toward the printed circuit board assembly;

a second plate being supported by a second guide system, being moveably coupled to said first plate, being movable along a second path of conveyance, having a power input connector conveying power to said power input pins of the printed circuit board assembly, and having a signal interface connector conveying signals to and from said signal interface pins of the printed circuit board assembly;

a first control unit being operationally coupled to said first plate and controlling movement of said first plate along said first path of conveyance, and being operationally coupled to said second plate and controlling movement of said second plate along said second path of conveyance, said first path of conveyance being different from said second path of conveyance;

said first plate moving along said first path of conveyance connecting electrically said plurality of disk connector pins with the printed circuit board assembly, in accordance with said first control unit;

said first plate moving a first predetermined distance along said first path of conveyance, pressing the printed circuit board assembly toward said pin board, and connecting electrically said first plurality of connection pins with the printed circuit board assembly, in accordance with said first control unit;

said first plate moving a second predetermined distance along said first path of conveyance, pressing the printed circuit board assembly toward said pin board, and connecting electrically said second plurality of connection pins with the printed circuit board assembly, in accordance with said first control unit; and said second plate moving along said second path of conveyance, connecting said power input connector with said power input pins, and connecting said signal interface connector with said signal interface pins, in accordance with said first control unit.

14. The apparatus of claim 13, said mounting unit further comprising:

a masking board, said masking board being movably coupled to said pin board, said masking board being movable toward and away from said pin board, said masking board being disposed between said pin board and said first plate, said masking board receiving the printed circuit board assembly;

said first plate moving said first predetermined distance along said first path of conveyance, pressing the printed circuit board assembly and said masking board toward said pin board, and connecting electrically said first plurality of connection pins with the printed circuit board assembly through said masking board, in accordance with said first control unit; and said first plate moving said second predetermined distance along said first path of conveyance, pressing the printed circuit board assembly and said masking board toward said pin board, and connecting electrically said second plurality of connection pins with the printed circuit board assembly through said masking board, in accordance with said first control unit.

15. The apparatus of claim 14, further comprising elastic units being installed to absorb shock generated when the printed circuit board assembly loaded onto said masking board is pressed toward said pin board, said elastic units being coupled to at least one selected from among said masking board and said pin board.

16. The apparatus of claim 13, said first guide system comprising guide rods guiding said first plate along said first path of conveyance.

17. The apparatus of claim 13, said first control unit further comprising:

a first driving unit moving said first plate when said first driving unit is driven; and a second driving unit moving said second plate when said second driving unit is driven.

18. The apparatus of claim 13, said first path of conveyance being toward and away from said base, said second path of conveyance being back and forth across said base.

19. The apparatus of claim 13, said first plurality of connection pins corresponding to in-circuit test process connection pins conveying electrical test signals during in-circuit testing, said second plurality of connection pins corresponding to function-circuit test process connection pins conveying electrical test signals during functional testing.

20. The apparatus of claim 17, further comprising a display unit receiving results of said in-circuit testing and said functional testing, said display unit displaying said results to a user.

* * * * *